US012750980B2

(12) United States Patent
Zhan et al.

(10) Patent No.: US 12,750,980 B2
(45) Date of Patent: Sep. 29, 2026

(54) SERVER

(71) Applicant: BITMAIN TECHNOLOGIES INC., Beijing (CN)

(72) Inventors: Ketuan Zhan, Beijing (CN); Yang Li, Beijing (CN); Hongbo Zeng, Beijing (CN); Jinbao Zhang, Beijing (CN); Mingliang Hao, Beijing (CN)

(73) Assignee: BITMAIN TECHNOLOGIES INC., Beijing (CN)

( * ) Notice: Subject to any disclaimer, the term of this patent is extended or adjusted under 35 U.S.C. 154(b) by 232 days.

(21) Appl. No.: 18/602,801

(22) Filed: Mar. 12, 2024

(65) Prior Publication Data

US 2024/0224473 A1 Jul. 4, 2024

Related U.S. Application Data

(63) Continuation of application No. PCT/CN2022/112247, filed on Aug. 12, 2022.

(30) Foreign Application Priority Data

Sep. 13, 2021 (CN) ......................... 202122211635.4

(51) Int. Cl.
*H05K 7/20* (2006.01)
*G06F 1/20* (2006.01)

(52) U.S. Cl.
CPC ......... *H05K 7/20727* (2013.01); *G06F 1/206* (2013.01); *H05K 7/20436* (2013.01); *H05K 7/20172* (2013.01)

(58) Field of Classification Search
CPC ............................ H05K 7/20727; G06F 1/206
See application file for complete search history.

(56) References Cited

U.S. PATENT DOCUMENTS 3,909,679 A * 9/1975 Petri .......................... G07F 9/10 361/709
9,351,424 B2 * 5/2016 Facusse ............. H05K 7/20418
2015/0188269 A1 * 7/2015 Kim ..................... H01R 25/003 439/638

FOREIGN PATENT DOCUMENTS

CN 1629770 A 6/2005
CN 101498958 A 8/2009
CN 107765795 A 3/2018
CN 110471512 A 11/2019
(Continued)

OTHER PUBLICATIONS

CN 209962183 U, English translation (Year: 2019).*
(Continued)

*Primary Examiner* — Mandeep S Buttar

(57) ABSTRACT

Provided is a server (100), which is applicable to the technical field of electronic devices. The server (100) includes a server main body (110), a power supply (120), and a heat conduction layer (130), where the server main body (110) includes a chassis (111), a first circuit board assembly (112), and a heat dissipation fan assembly (113); the first circuit board assembly (112) is installed in the chassis (111); and the heat dissipation fan assembly (113) is installed on the chassis (111) to dissipate heat of the first circuit board assembly (112). The power supply (120) is installed on one side of the chassis (111); and the heat conduction layer (130) is arranged between the power supply (120) and the chassis (111) to conduct heat generated by the power supply (120) to the chassis (111).

17 Claims, 7 Drawing Sheets

(56) References Cited

FOREIGN PATENT DOCUMENTS

| | | | | |
|---|---|---|---|---|
| CN | 209962183 | U | * | 1/2020 |
| CN | 212112326 | U | * | 12/2020 |
| CN | 215987101 | U | | 3/2022 |
| DE | 20312963 | U1 | | 10/2003 |
| JP | 2011108997 | A | | 6/2011 |

OTHER PUBLICATIONS

CN-212112326-U English translation (Year: 2020).*
International Search Report dated Oct. 25, 2022 regarding International Application No. PCT/CN2022/112247.
Grant of Utility Model Patent Notification dated Jan. 10, 2024 regarding Chinese Application No. 202122211635.4.

* cited by examiner

SERVER

CROSS-REFERENCE TO RELATED APPLICATIONS

This application is a continuation of International Application No. PCT/CN2022/112247, filed on Aug. 12, 2022, which claims priority to Chinese Patent Application No. 202122211635.4, filed on Sep. 13, 2021, both of which are hereby incorporated by reference in their entireties.

TECHNICAL FIELD

The present application relates to the technical field of electronic devices, and in particular to a server.

BACKGROUND

At present, a power supply for common mining machines, servers and other products has multiple fans installed on a main body of the power supply. When a device is running, the fans on the power supply are started to provide a certain amount of wind to dissipate heat of heat generating components inside the power supply, the fans on the power supply themselves cause additional energy loss to the product, and this energy loss is inseparable from this air-cooled heat dissipation method. As long as the power supply has fans, this energy loss is inevitable. Moreover, the arrangement of fans on the power supply will make the sealing performance of the power supply poor, and dust will enter from fan ports, resulting in a low reliability of the power supply. In addition, the power supply fans have a high failure rate and will bring additional noise to the application of the product.

SUMMARY

An objective of the present application is to provide a server, which aims to solve the technical problems of poor sealing performance, low reliability and high energy consumption of a power supply.

In order to achieve the above objective, the present application provides the following solution. A server, including:

- a server main body, including a chassis, a first circuit board assembly and a heat dissipation fan assembly; the first circuit board assembly is installed in the chassis, and the heat dissipation fan assembly is installed on the chassis to dissipate heat of the first circuit board assembly;
- a power supply, installed on a side of the chassis;
- a heat conduction layer, arranged between the power supply and the chassis to conduct heat generated by the power supply to the chassis.

In an implementation the power supply includes a housing and a second circuit board assembly, the housing is provided with a cavity, and the second circuit board assembly is at least partially accommodated in the cavity, and the second circuit board assembly is attached to the side of the chassis through the heat conduction layer, the housing is connected to the chassis and/or the second circuit board assembly, and the second circuit board assembly is electrically connected to the first circuit board assembly.

In an implementation the second circuit board assembly includes a substrate, a heat generating device and a heat sink, the heat generating device is installed on a side of the substrate facing away from the heat conduction layer, the heat sink is connected to the substrate, and the heat sink abuts against the heat generating device.

In an implementation the substrate is made of aluminum or copper or titanium alloy, the heat sink is protrudingly disposed on the side of the substrate facing away from the heat conduction layer, and the heat sink is installed or integrally formed on the substrate, the heat conduction layer is coated and molded on a surface of the chassis facing the second circuit board assembly and/or coated and molded on a surface of the substrate facing the chassis.

In an implementation the substrate is made of a resin, and the second circuit board assembly further includes a heat dissipation panel, the heat dissipation panel is arranged at a side of the substrate facing away from the heat generating device, and the heat sink is installed on the heat dissipation panel extends through the substrate to abut against the heat generating device, and the heat conduction layer is coated and molded on a surface of the chassis facing the second circuit board assembly and/or a surface of the heat dissipation panel facing the surface of the chassis.

In an implementation the cavity has an opening open to the chassis, the cavity is filled with a heat-conducting plastic sealing adhesive, and an end of the housing close to the opening is attached to the chassis and/or the second circuit board assembly to seal the cavity.

In an implementation the heat conduction layer is a heat-conducting silicone grease coated and molded on an outer surface of the chassis and/or an outer surface of the power supply; or, the heat conduction layer is a heat-conducting adhesive coated and molded on the outer surface of the chassis and/or the outer surface of the power supply.

In an implementation a heat dissipation fin is protrudingly disposed in the housing, and the heat dissipation fin is protrudingly disposed on an inner surface of the housing close to the power supply.

In an implementation the chassis is formed with an inner cavity, an air inlet and an air outlet, the air inlet and the air outlet are respectively communicated with the inner cavity, the first circuit board assembly is installed in the inner cavity, and the heat dissipation fan assembly is arranged at the air inlet and/or the air outlet.

In an implementation the heat dissipation fan assembly includes a first fan and a second fan, the first fan is installed at the air inlet, and the second fan is installed at the air outlet.

The beneficial effects of the present application are as follows.

The power supply is installed on one side of the chassis, and the heat conduction layer is arranged between the power supply and the chassis. The heat generated by the power supply is conducted to the chassis of the server main body through the heat conduction layer, and the heat generated by the power supply is dissipated by the heat dissipation fan assembly on the server main body, so as to avoid setting up a fan on the power supply, so that the power supply maintains good sealing performance, thereby solving the problems of corrosion of the power supply and high failure of the power supply fan, improving the reliability of the power supply, reducing the energy consumption and noise of the whole machine, improving the overall system efficiency, and reducing costs.

BRIEF DESCRIPTION OF DRAWINGS

In order to more clearly illustrate the technical solutions in the embodiments of the present application or the prior art, the following will briefly introduce the drawings that need to be used in the description of the embodiments or the prior art. Obviously, the accompanying drawings in the following description are only some embodiments of the present application, and those skilled in the art can also obtain other drawings according to the structures shown in these drawings without creative effort.

Figure 1:
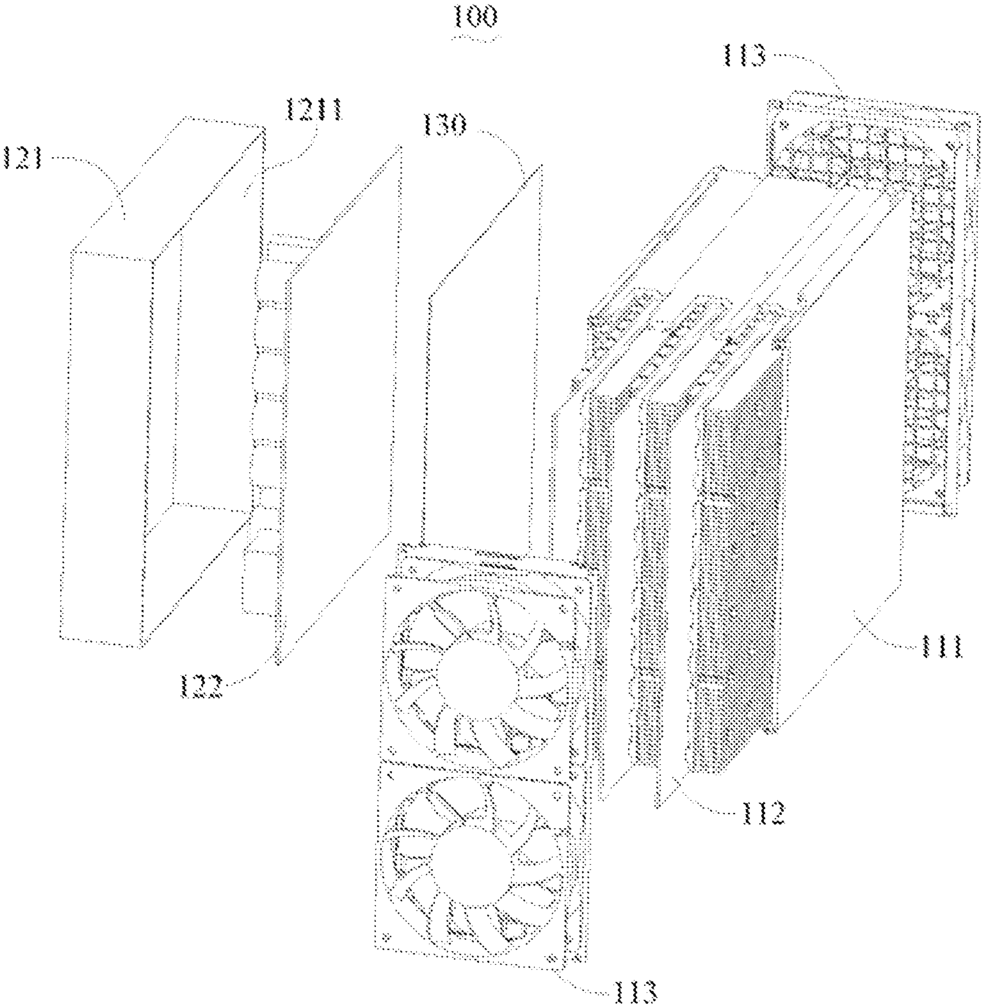
FIG. 1 is an exploded view of a server provided by Embodiment 1 of the present application.

Description of reference numbers: 100, server; 110, server main body; 111, chassis; 1111, heat dissipation fin; 1112, inner cavity; 1113, air inlet; 1114, air outlet; 112, first circuit board assembly; 113, heat dissipation fan assembly; 1131, first fan; 1132, second fan; 120, power supply; 121, housing; 1211, cavity body; 122, second circuit board assembly; 1221, substrate; 1222, heat generating device; 1223, heat sink; 1224, heat dissipation panel; 130, heat conduction layer.

DESCRIPTION OF EMBODIMENTS

The following will clearly and completely describe the technical solutions in the embodiments of the present application with reference to the accompanying drawings in the embodiments of the present application. Obviously, the described embodiments are only part of the embodiments of the present application, not all of them. Based on the embodiments in the present application, all other embodiments obtained by persons of ordinary skill in the art without creative efforts fall within the protection scope of the present application.

It should be noted that all directional indications (such as up, down, left, right, front, back . . . ) in the embodiments of the present application are only used to explain the relative positional relationship and movement conditions between various components in a certain posture, and if the specific posture changes, the directional indication also changes accordingly.

It should also be noted that when an element is referred to as being "fixed to" or "disposed on" another element, it can be directly located on the other element or an intervening element may also exist. When an element is referred to as being "connected to" another element, it can be directly connected to the other element or indirectly connected to the other element through an intervening element.

In addition, the descriptions involving "first", "second" and so on in the present application are only for the purpose of description, and should not be understood as indicating or implying their relative importance or implicitly specifying the quantity of the indicated technical features. Thus, the features defined as "first" and "second" may explicitly or implicitly include at least one of these features. In addition, the technical solutions of various embodiments can be combined with each other only if they can be realized by those skilled in the art. When a combination of technical solutions is contradictory or cannot be realized, it should be considered that the combination of technical solutions does not exist, nor within the scope of protection of the present application.

Embodiment 1

As shown in FIG. 1 to FIG. 5, a server 100 provided in an embodiment of the present application includes: a server main body 110, a power supply 120, and a heat conduction layer 130. The server main body 110 includes a chassis 111, a first circuit board assembly 112, and a heat dissipation fan assembly 113; the first circuit board assembly 112 is installed in the chassis 111, and the heat dissipation fan assembly 113 is installed on the chassis 111 to dissipate heat of the first circuit board assembly 112. The power supply 120 is installed on one side of the chassis 111. The heat conduction layer 130 is arranged between the power supply 120 and the chassis 111 to conduct the heat generated by the power supply 120 to the chassis 111. The power supply 120 is installed on one side of the chassis 111, and the heat conduction layer 130 is also provided between the power supply 120 and the chassis 111. The heat generated by the power supply 120 is conducted to the chassis 111 of the server main body 110 through the heat conduction layer 130. The heat dissipation fan assembly 113 of the server main body 110 dissipates heat generated by the power supply 120, thereby avoiding setting a fan on the power supply 120, so that the power supply 120 maintains good sealing performance, thereby solving the problems of corrosion of the power supply 120 and high failure of the power supply fan, improving the reliability of the power supply 120, reducing the energy consumption and noise of the whole machine, improving the overall efficiency of the system, and reducing costs.

Figure 3:
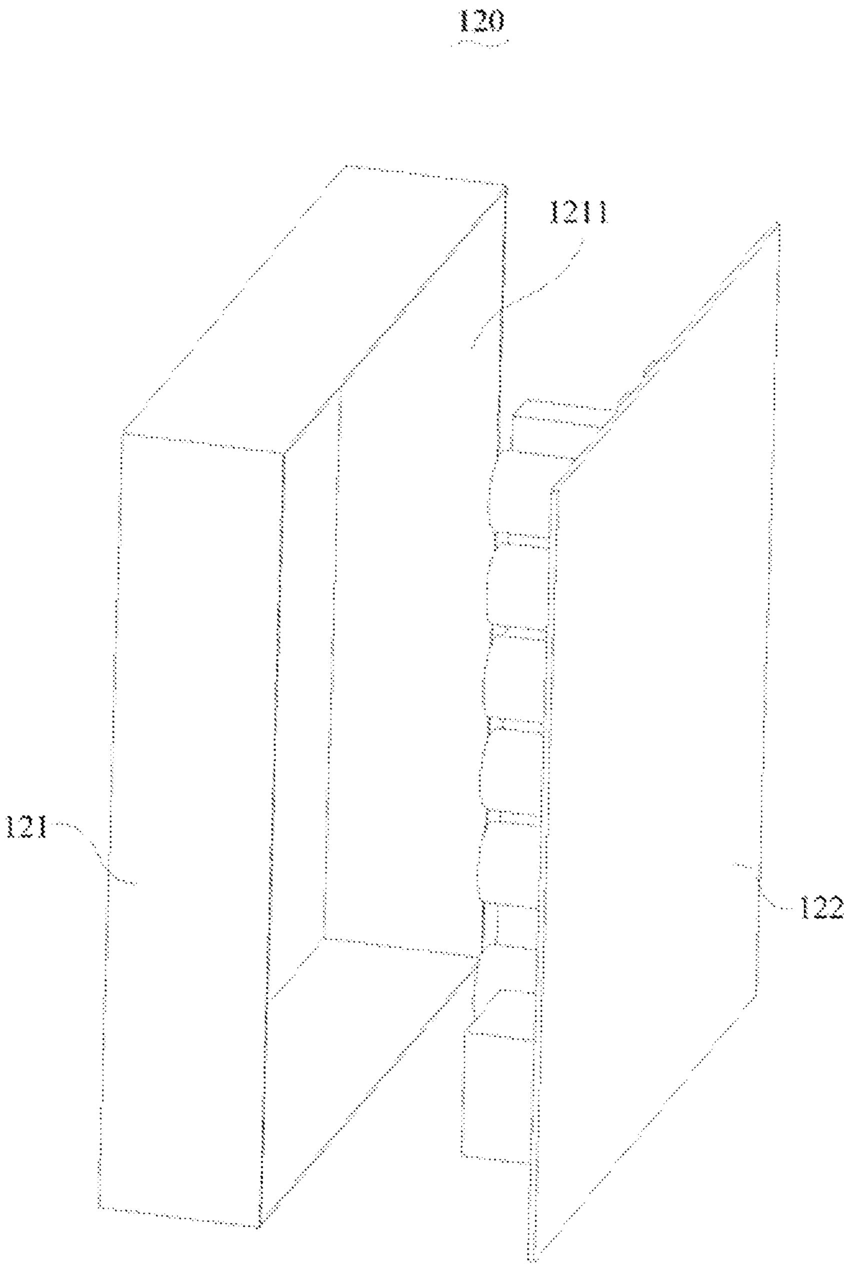
FIG. 3 is an exploded view of a power supply provided by Embodiment 1 of the present application.

As shown in FIG. 1 and FIG. 3, in an implementation, the power supply 120 includes a housing 121 and a second circuit board assembly 122, the housing 121 is provided with a cavity 1211, and the second circuit board assembly 122 is at least partially accommodated in the cavity 1211, the second circuit board assembly 122 is attached to one side of the chassis 111 through the heat conduction layer 130, the housing 121 is connected to the chassis 111 and/or the second circuit board assembly 122, and the second circuit board assembly 122 is electrically connected to the first circuit board assembly 112. In the server 100 provided in the present embodiment, there are the following three connection methods for the housing 121: 1) the housing 121 is connected to the chassis 111, and at this time the second circuit board assembly 122 is completely placed in the cavity 1211 and attached to the chassis 111 through the heat conduction layer 130; 2) the housing 121 is connected to one end of the second circuit board assembly 122, and the other end of the second circuit board assembly 122 is attached to the chassis 111, and only part of the second circuit board assembly 122 is placed in the cavity 1211; 3) the housing 121 is connected to the chassis 111 and the second circuit board assembly 122, respectively, and the second circuit board assembly 122 is completely placed in the cavity 1211 and attached to the chassis 111 through the heat conduction layer 130. The housing 121 is connected to the chassis 111 through at least one of screw connection, magnetic connection, adhesive connection, and snap connection.

Figure 4:
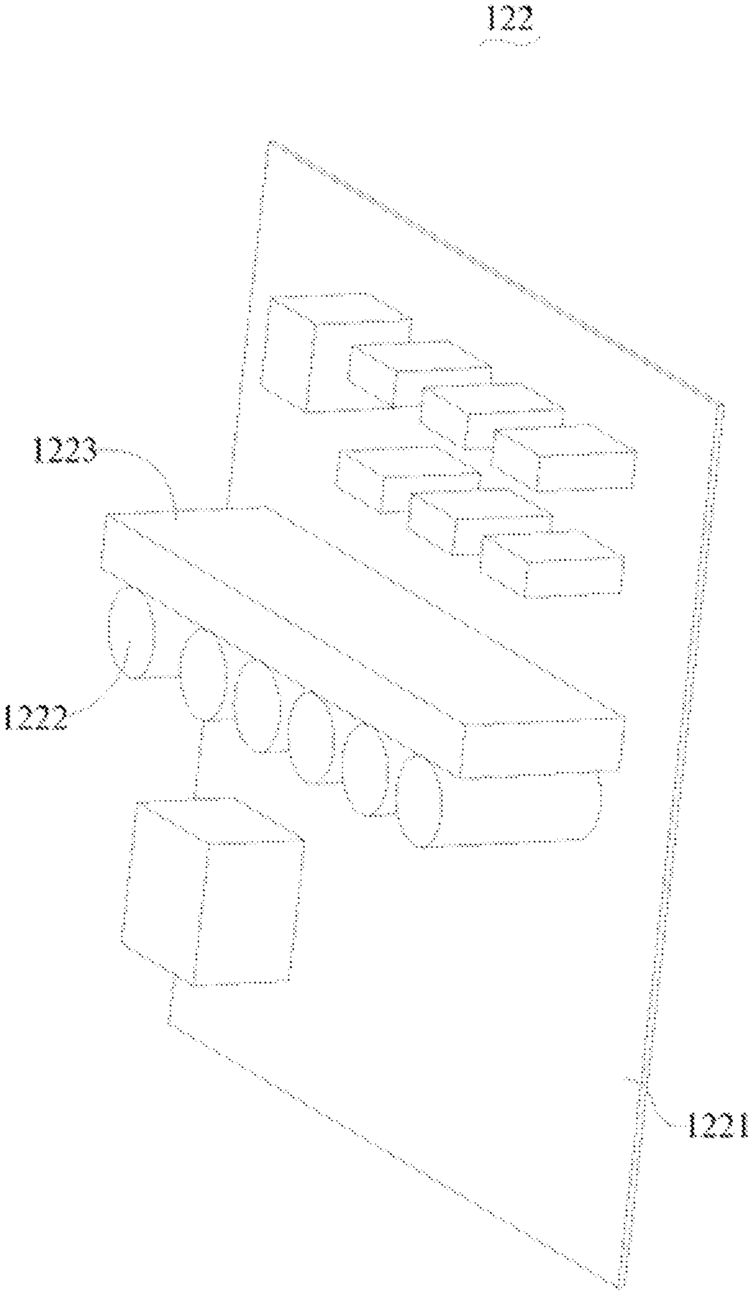
FIG. 4 is a schematic perspective view of a second circuit board assembly provided by Embodiment 1 of the present application.

As shown in FIG. 1 and FIG. 4, in an implementation, the second circuit board assembly 122 includes a substrate 1221, a heat generating device 1222, and a heat sink 1223. The heat generating device 1222 is installed on a side of the substrate 1221 facing away from the heat conduction layer 130, and the heat sink 1223 is connected to the substrate 1221, and the heat sink 1223 abuts against the heat generating device 1222. The heat generating device 1222 abuts against the heat sink 1223, and when the power supply 120 is working, the heat generated by the heat generating device 1222 is conducted to the chassis 111 through the heat sink 1223, and then dissipated by the heat dissipation fan assembly 113 installed on the chassis 111. When the housing 121 is connected to the second circuit board assembly 122, the heat generating device 1222 and the heat sink 1223 are all placed in the cavity 1211.

As shown in FIG. 1 and FIG. 4, in an implementation, the substrate 1221 is made of aluminum, or copper, or titanium alloy, and the heat sink 1223 is protrudingly disposed on a side of the substrate 1221 facing away from the heat conduction layer 130, and the heat sink 1223 is installed or integrally formed on the substrate 1221, the heat conduction layer 130 is coated and molded on a surface of the chassis 111 facing the second circuit board assembly 122 and/or coated and molded on a surface of the substrate 1221 facing the chassis 111. The substrate 1221 provided in the present embodiment is an aluminum substrate, which is more suitable for a SMT process, and has a long service life and a high reliability. Certainly, in a specific application, it is not limited to the aluminum substrate, for example, as an alternative solution, the substrate 1221 may also be made of copper or titanium alloy. The heat sink 1223 is integrally formed on the substrate 1221, which has a better heat dissipation effect and its processing is convenient. Of course, in a specific application, the substrate 1221 and the heat sink 1223 can also be processed separately, and then the heat sink 1223 is installed on the substrate 1221. The heat conduction layer 130 is coated and molded on an outer surface of the chassis 111 facing the second circuit board assembly 122; or coated and molded on an outer surface of the substrate 1221 facing the chassis 111; or coated and molded both on the outer surface of the chassis 111 facing the second circuit board assembly 122 and the outer surface of the substrate 1221 facing the chassis 111.

As shown in FIG. 1 and FIG. 3, in an implementation, the cavity 1211 has an opening open to the chassis 111, the cavity 1211 is filled with a heat-conducting plastic sealing adhesive, and an end of the housing 121 close to the opening is attached to the chassis 111 and/or the second circuit board assembly 122 to seal the cavity 1211. Exemplarily, when the housing 121 is connected to the chassis 111, one end of the opening is attached to the chassis 111 to seal the cavity 1211. When the housing 121 is connected to the second circuit board assembly 122, one end of the opening is attached to the substrate 1221 to seal the cavity 1211; when the housing 121 is connected to the housing 111 and the second circuit board assembly 122, one end of the opening is attached to the housing 111 to seal the cavity 1211. Filling the cavity 1211 with the heat-conducting plastic sealing adhesive enables the heat generating device 1222 to obtain a larger contact area with the heat sink 1223, thereby reducing thermal resistance and increasing the heat dissipation effect of the heat sink 1223. It should be noted that the form of filling with the adhesive can be completely filling the cavity 1211 with the adhesive, or partially filling the cavity with the adhesive according to needs, or filling the cavity incompletely with a small amount of adhesive, and the form of filling is not excessively limited therein.

Figure 2:
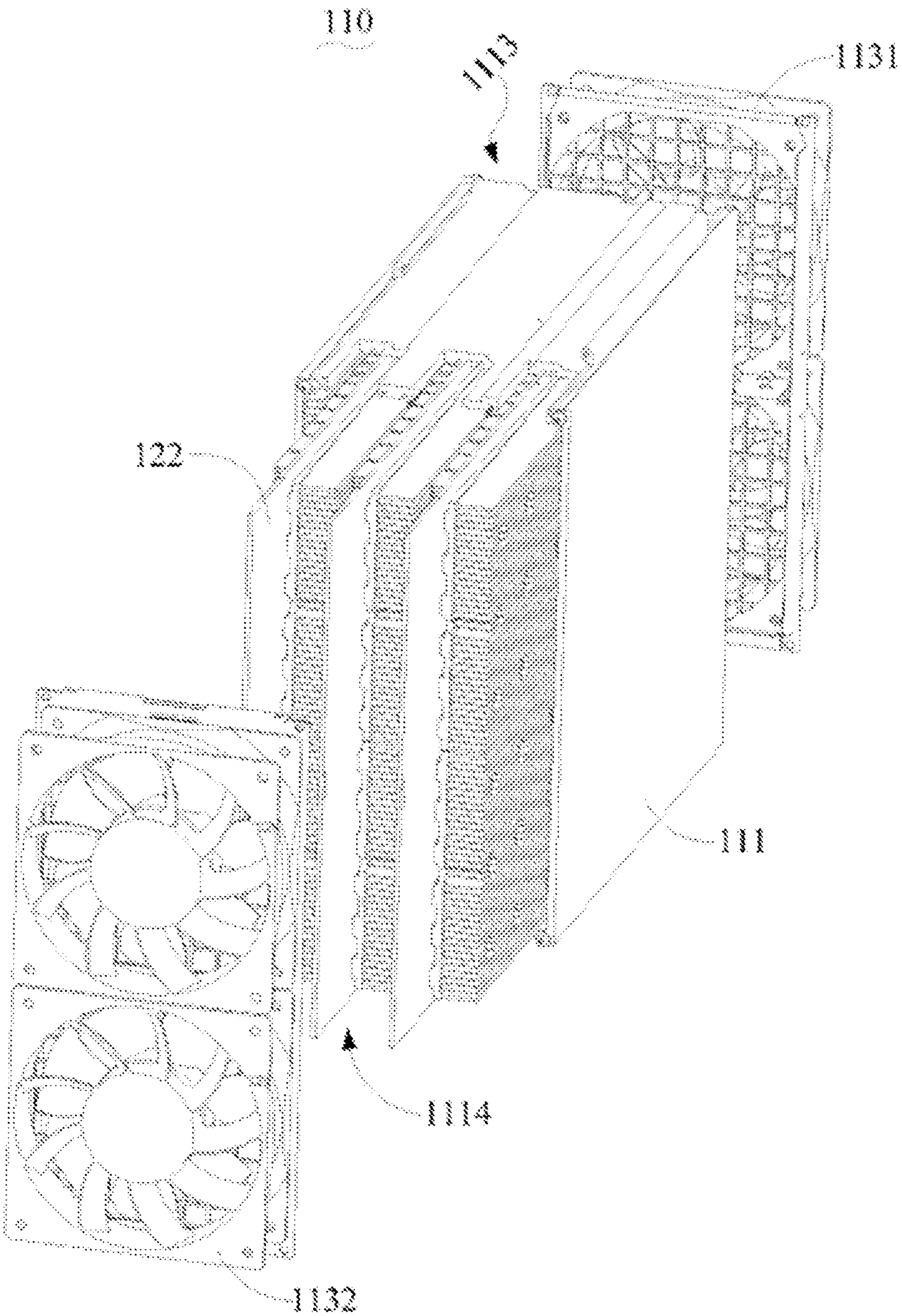
FIG. 2 is an exploded view of a server main body provided by Embodiment 1 of the present application.

As shown in FIG. 1 and FIG. 2, in an implementation, the heat conduction layer 130 is a heat-conducting silicone grease coated and molded on the outer surface of the chassis 111 and/or an outer surface of the power supply 120; the heat-conducting silicone grease is also called heat dissipation paste, which is an organic-silicone-grease-like compound made of organic silicone as a main raw material and other auxiliary materials. The heat-conducting silicone grease has good thermal conductivity and insulation and can be used for a long time in a high and low temperature environment, and is beneficial for prolonging the service life of the server 100 to a certain extent. The heat conduction silicone grease is coated and molded on the outer surface of the chassis 111, or coated and molded on the outer surface of the power supply 120, or coated and molded both on the outer surfaces of the chassis 111 and the power supply 120. Of course, in a specific application, the heat conduction layer 130 is not limited to the use of the heat conduction silicone grease, for example, as an alternative solution, a heat-conducting adhesive may also be used.

Figure 5:
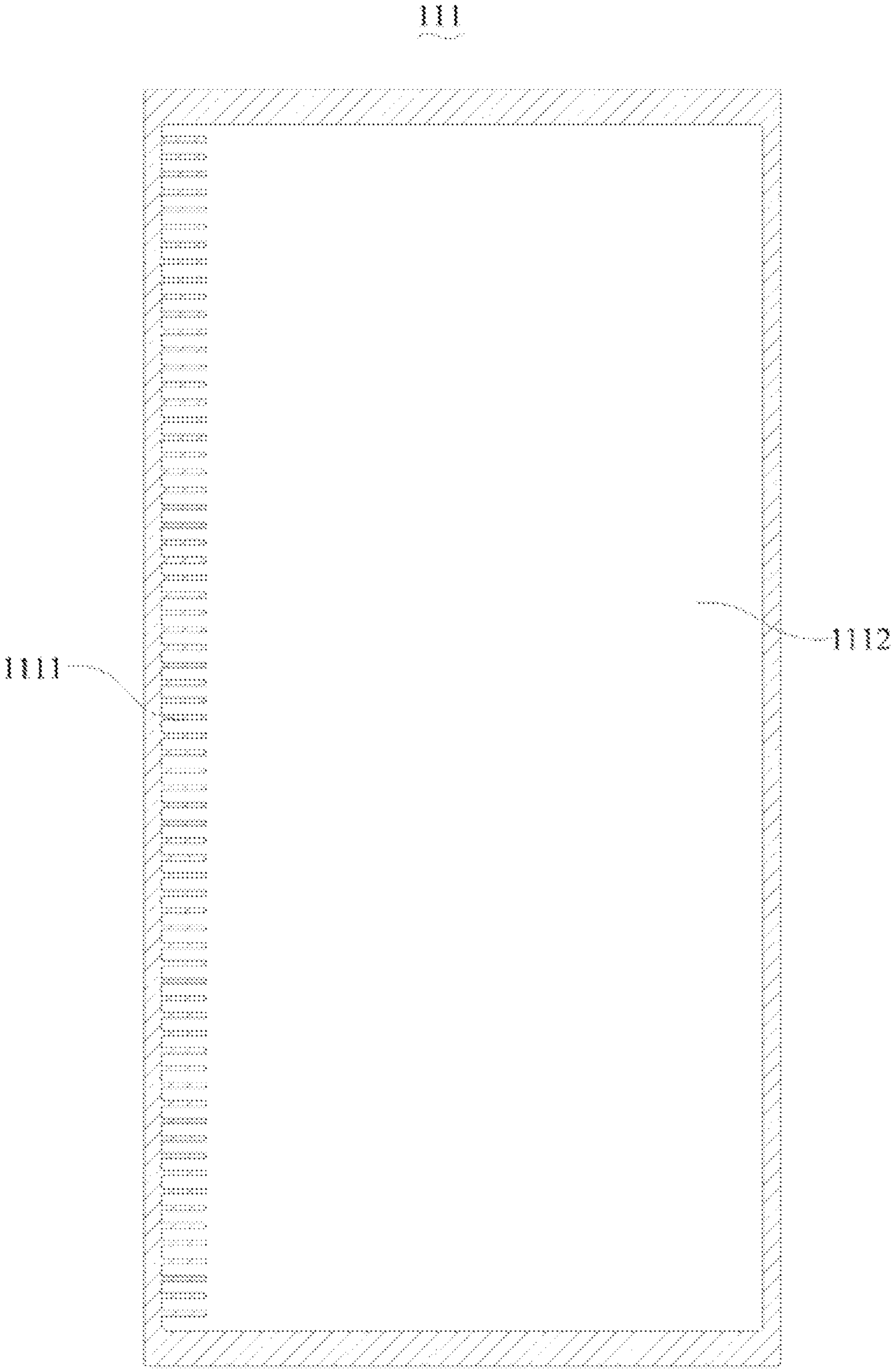
FIG. 5 is a sectional view of a chassis provided by Embodiment 1 of the present application.

As shown in FIG. 1 and FIG. 5, in an implementation, heat dissipation fins 1111 are protrudingly disposed in the chassis 111, and the heat dissipation fins 1111 are protrudingly disposed on an inner surface of the chassis 111 close to the power supply 120. The heat dissipation fins 1111 are provided in the chassis 111 to improve the heat dissipation effect. Of course, in a specific application, the heat dissipation fins 1111 may not be provided in the chassis 111, but the heat dissipation effect is worse than that the provision of the heat dissipation fins 1111.

As shown in FIG. 2 and FIG. 5, in an implementation, the chassis 111 is formed with an inner cavity 1112, an air inlet 1113, and an air outlet 1114. The air inlet 1113 and the air outlet 1114 communicate with the inner cavity 1112 respectively, and the first circuit board assembly 112 is installed in the inner cavity 1112, and the heat dissipation fan assembly 113 is arranged at the air inlet 1113 and/or the air outlet 1114. The air inlet 1113 and the air outlet 1114 are respectively arranged on opposite sides of the chassis 111, which is beneficial for forming convection, thereby forming a good ventilation and heat dissipation effect.

As shown in FIG. 1 and FIG. 2, in an implementation, the heat dissipation fan assembly 113 includes a first fan 1131 and a second fan 1132, the first fan 1131 is installed at the air inlet 1113, and the second fan 1132 is installed at the air outlet 1114. Exemplarily, in the present embodiment, two first fans 1131 and two second fans 1132 are provided, the two first fans 1131 are installed vertically side-by-side at the air inlet 1113 of the chassis 111, and the two second fans 1132 are installed vertically side-by-side at the air outlet 1114 of the chassis 111. The first fans 1131 installed at the air inlet 1113 draw air in, and the second fans 1132 installed at the air outlet 1114 draw air out, further improving the heat dissipation effect.

The following describes the working principle of the server 100 with reference to FIG. 1.

When the server 100 is working, the second circuit board assembly 122 on the power supply 120 and the first circuit board assembly 112 on the server main body 110 generate heat; the heat generated by the second circuit board assembly 122 is directly conducted to the chassis 111 of the server main body 110 through the heat conduction layer 130, the heat generated by the first circuit board assembly 112 and the second circuit board assembly 122 is dissipated by the heat dissipation fan assembly 113 installed on the chassis 111. By sharing a fan, it is avoided to install a fan on the power supply 120, so that the power supply 120 maintains a good sealing performance, thereby solving the problems of the corrosion of the power supply 120 and the high failure of the fan of the power supply 120, improving the reliability of the power supply 120, reducing the energy consumption of the whole machine and noise, improving the overall efficiency of the system, and reducing costs.

Embodiment 2

Figure 6:
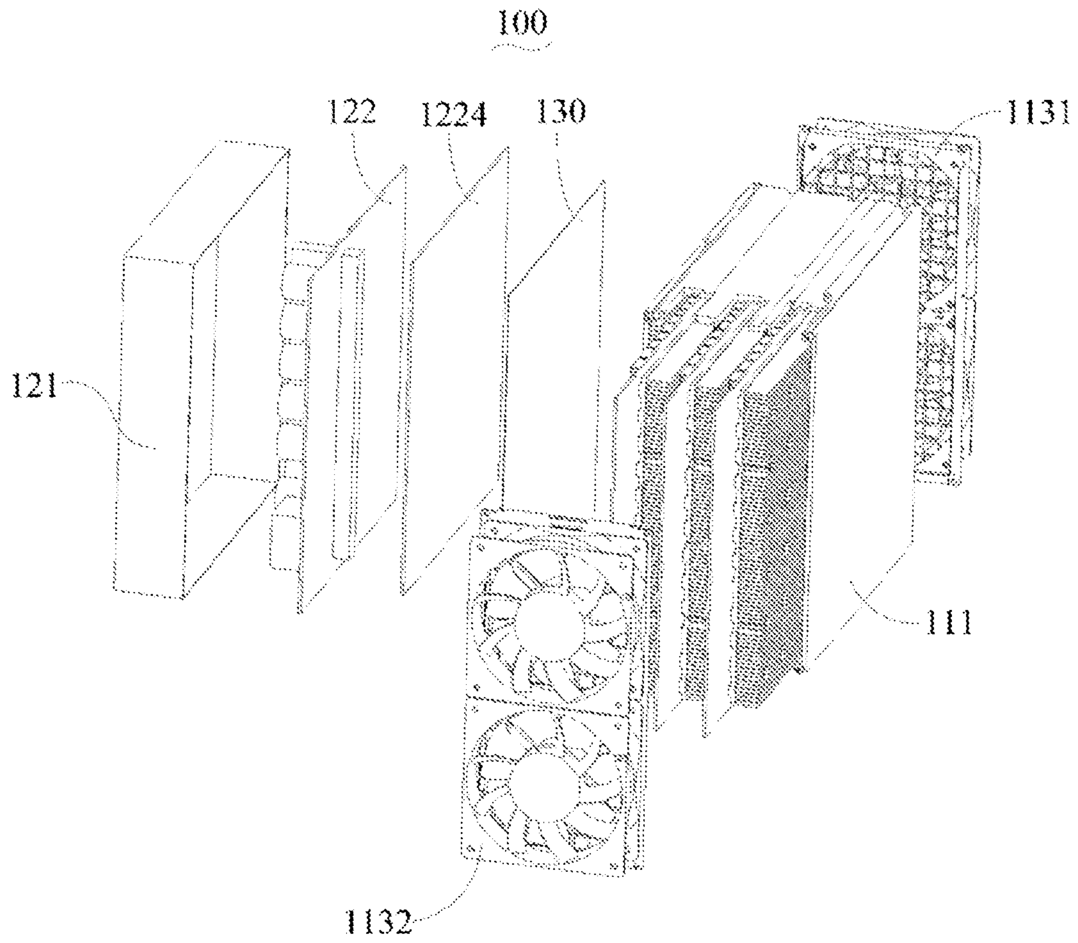
FIG. 6 is an exploded view of a server provided by Embodiment 2 of the present application.
Figure 7:
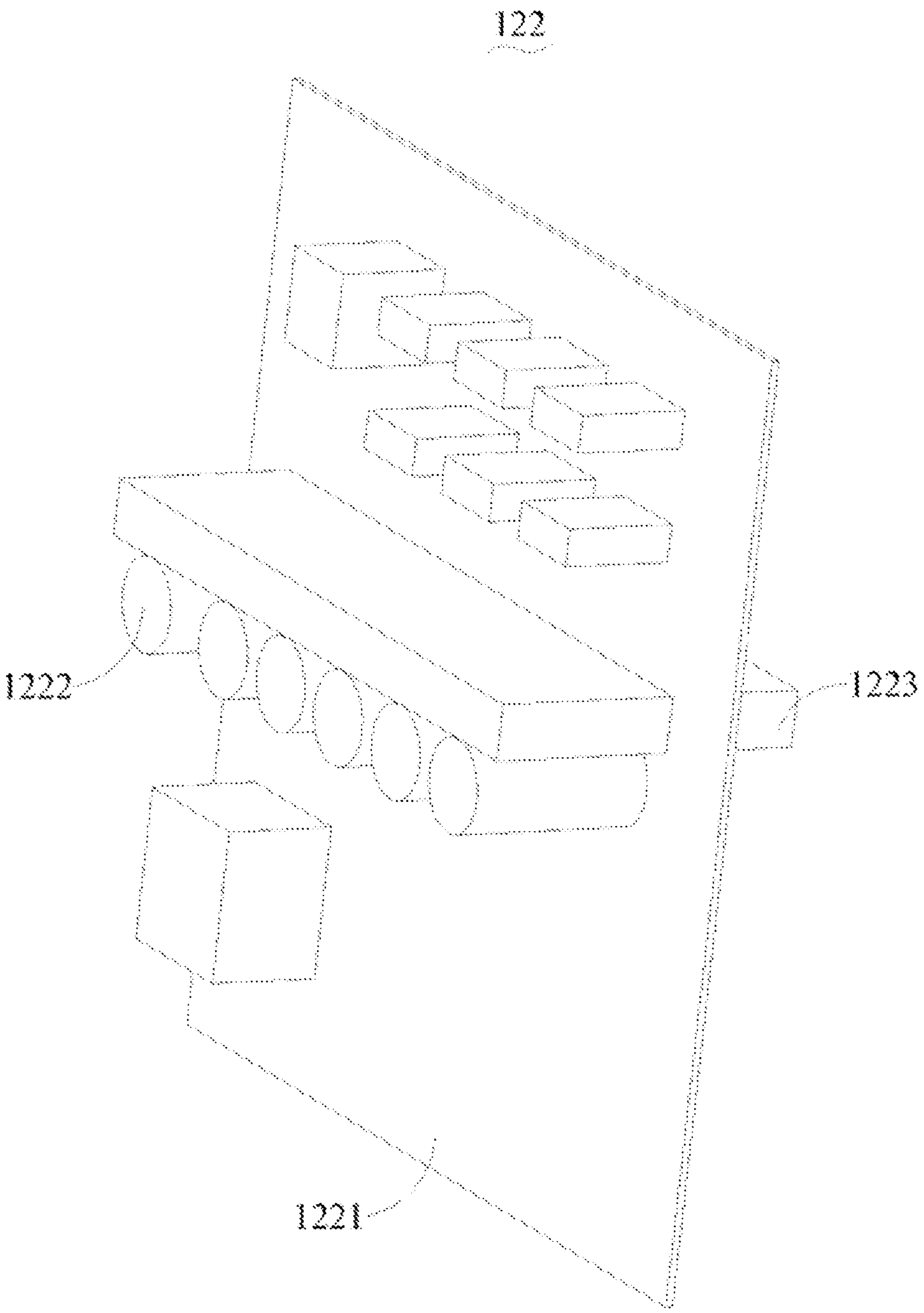
FIG. 7 is a schematic perspective view of a second circuit board assembly provided by Embodiment 2 of the present application.

As shown in FIG. 6 and FIG. 7, the present embodiment differs from Embodiment 1 in that the substrate 1221 is made of a different material, which is specifically reflected in the following.

As shown in FIG. 6 and FIG. 7, in an implementation, the substrate 1221 is made of a resin, the second circuit board assembly 122 further includes a heat dissipation panel 1224, and the heat dissipation panel 1224 is arranged on a side of the substrate 1221 facing away from the heat generating device 1222. The heat sink 1223 is installed on the heat dissipation panel 1224 and extends through the substrate 1221 to abut against the heat generating device 1222. The heat conduction layer 130 is coated and molded on the surface of the chassis 111 facing the second circuit board assembly 122 and/or the surface of the heat dissipation panel 1224 facing the chassis 111. The substrate 1221 made of a resin is also called an epoxy resin plate. A circuit board made of the epoxy resin plate cannot directly conduct heat, so the heat dissipation panel 1224 needs to be added between the second circuit board assembly 122 and the chassis 111. One end of the heat sink 1223 abuts against the heat generating device 1222, and the other end passes through the substrate 1221 and abuts against one end of the heat dissipation panel 1224, and the other end of the heat dissipation panel 1224 is attached to the surface of the chassis 111 through the heat conduction layer 130. At this time, the heat generated by the heat generating device 1222 is first conducted to the heat dissipation panel 1224 through the heat sink 1223, and then conducted to the chassis 111 by the heat dissipation panel 1224 for heat dissipation. The heat conduction layer 130 is coated and molded on the surface of the chassis 111 facing the second circuit board assembly 122, or coated and molded on the surface of the heat dissipation panel 1224 facing the chassis 111, or coated and molded both on the surface of the chassis 111 facing the second circuit board assembly 122 and the surface of the heat dissipation panel 1224 facing the chassis 111.

The working principle of the server 100 is described below with reference to FIG. 6.

When the server 100 is working, the second circuit board assembly 122 on the power supply 120 and the first circuit board assembly 112 on the server main body 110 generate heat; the heat generated by the second circuit board assembly 122 is conducted to the chassis 111 of the server main body 110 through the heat dissipation panel 1224 and the heat conduction layer 130, the heat generated by the first circuit board assembly 112 and the second circuit board assembly 122 is dissipated by the heat dissipation fan assembly 113 installed on the chassis 111. By sharing a fan, it is avoided to install a fan on the power supply 120, so that the power supply 120 maintains a good sealing performance, thereby solving the problems of the corrosion of the power supply 120 and the high failure of the fan of the power supply 120, improving the reliability of the power supply 120, reducing the energy consumption of the whole machine and noise, improving the overall efficiency of the system, and reducing costs.

Except for the above differences, the structure of the server 100 and its components provided in the present embodiment can be optimally designed with reference to Embodiment 1, and will not be described in detail herein.

The above are merely embodiments of the present application, and are not intended to limit the patent scope of the present application. Under the application concept of the present application, all equivalent structural changes made by using the contents of the description and the accompanying drawings of the application, or all direct/indirect applications in other related technical fields are included in the scope of patent protection of the present application.

What is claimed is:

1. A server, comprising:

a server main body, comprising a chassis, a first circuit board assembly, and a heat dissipation fan assembly; the first circuit board assembly is installed in the chassis, and the heat dissipation fan assembly is installed on the chassis to dissipate heat of the first circuit board assembly;

a power supply, installed on a side of the chassis;

a heat conduction layer, arranged between the power supply and the chassis to conduct heat generated by the power supply to the chassis;

wherein the power supply comprises a housing and a second circuit board assembly, the housing is provided with a cavity, and the second circuit board assembly is at least partially accommodated in the cavity, the second circuit board assembly is attached to the side of the chassis through the heat conduction layer, the housing is connected to the chassis and/or the second circuit board assembly, and the second circuit board assembly is electrically connected to the first circuit board assembly;

wherein the cavity has an opening open to the chassis, the cavity is filled with a heat-conducting plastic sealing adhesive, and an end of the housing close to the opening is attached to the chassis and/or the second circuit board assembly to seal the cavity.

2. The server according to claim 1, wherein the second circuit board assembly comprises a substrate, a heat generating device, and a heat sink, the heat generating device is installed on a side of the substrate facing away from the heat conduction layer, the heat sink is connected to the substrate, and the heat sink abuts against the heat generating device.

3. The server according to claim 2, wherein the substrate is made of aluminum, copper or titanium alloy, and the heat sink is protrudingly disposed on the side of the substrate facing away from the heat conduction layer, the heat sink is installed or integrally formed on the substrate, the heat conduction layer is coated and molded on a surface of the chassis facing the second circuit board assembly and/or coated and molded on a surface of the substrate facing the chassis.

4. The server according to claim 2, wherein the substrate is made of a resin, and the second circuit board assembly further comprises a heat dissipation panel, and the heat dissipation panel is arranged at a side of the substrate facing away from the heat generating device, the heat sink is installed on the heat dissipation panel and extends through the substrate to abut against the heat generating device, and the heat conduction layer is coated and molded on a surface of the chassis facing the second circuit board assembly and/or a surface of the heat dissipation panel facing the chassis.

5. The server according to claim 1, wherein the heat conduction layer is a heat-conducting silicone grease coated and molded on an outer surface of the chassis and/or an outer surface of the power supply; or, the heat conduction layer is a heat-conducting adhesive coated and molded on the outer surface of the chassis and/or the outer surface of the power supply.

6. The server according to claim 2, wherein the heat conduction layer is a heat-conducting silicone grease coated and molded on an outer surface of the chassis and/or an outer surface of the power supply; or, the heat conduction layer is a heat-conducting adhesive coated and molded on the outer surface of the chassis and/or the outer surface of the power supply.

7. The server according to claim 3, wherein the heat conduction layer is a heat-conducting silicone grease coated and molded on an outer surface of the chassis and/or an outer surface of the power supply; or, the heat conduction layer is a heat-conducting adhesive coated and molded on the outer surface of the chassis and/or the outer surface of the power supply.

8. The server according to claim 4, wherein the heat conduction layer is a heat-conducting silicone grease coated and molded on an outer surface of the chassis and/or an outer surface of the power supply; or, the heat conduction layer is a heat-conducting adhesive coated and molded on the outer surface of the chassis and/or the outer surface of the power supply.

9. The server according to claim 1, wherein a heat dissipation fin is protrudingly disposed in the housing, and the heat dissipation fin is protrudingly disposed on an inner surface of the housing close to the power supply.

10. The server according to claim 2, wherein a heat dissipation fin is protrudingly disposed in the housing, and the heat dissipation fin is protrudingly disposed on an inner surface of the housing close to the power supply.

11. The server according to claim 3, wherein a heat dissipation fin is protrudingly disposed in the housing, and the heat dissipation fin is protrudingly disposed on an inner surface of the housing close to the power supply.

12. The server according to claim 4, wherein a heat dissipation fin is protrudingly disposed in the housing, and the heat dissipation fin is protrudingly disposed on an inner surface of the housing close to the power supply.

13. The server according to claim 1, wherein the chassis is formed with an inner cavity, an air inlet and an air outlet, and the air inlet and the air outlet communicate with the inner cavity respectively, the first circuit board assembly is installed in the inner cavity, and the heat dissipation fan assembly is arranged at the air inlet and/or the air outlet.

14. The server according to claim 2, wherein the chassis is formed with an inner cavity, an air inlet and an air outlet, and the air inlet and the air outlet communicate with the inner cavity respectively, the first circuit board assembly is installed in the inner cavity, and the heat dissipation fan assembly is arranged at the air inlet and/or the air outlet.

15. The server according to claim 3, wherein the chassis is formed with an inner cavity, an air inlet and an air outlet, and the air inlet and the air outlet communicate with the inner cavity respectively, the first circuit board assembly is installed in the inner cavity, and the heat dissipation fan assembly is arranged at the air inlet and/or the air outlet.

16. The server according to claim 4, wherein the chassis is formed with an inner cavity, an air inlet and an air outlet, and the air inlet and the air outlet communicate with the inner cavity respectively, the first circuit board assembly is installed in the inner cavity, and the heat dissipation fan assembly is arranged at the air inlet and/or the air outlet.

17. The server according to claim 13, wherein the heat dissipation fan assembly comprises a first fan and a second fan, the first fan is installed at the air inlet, and the second fan is installed at the air outlet.

* * * * *